US007709907B2

(12) United States Patent
Gaul et al.

(10) Patent No.: US 7,709,907 B2
(45) Date of Patent: May 4, 2010

(54) ESD STRUCTURE

(75) Inventors: Stephen Joseph Gaul, Melbourne Village, FL (US); Michael D. Church, Sebastian, FL (US); James Edwin Vinson, Palm Bay, FL (US)

(73) Assignee: Intersil Americas Inc., Milpitas, CA (US)

( * ) Notice: Subject to any disclaimer, the term of this patent is extended or adjusted under 35 U.S.C. 154(b) by 169 days.

(21) Appl. No.: 11/267,175

(22) Filed: Nov. 7, 2005

(65) Prior Publication Data

US 2006/0097293 A1 May 11, 2006

Related U.S. Application Data

(60) Provisional application No. 60/625,584, filed on Nov. 8, 2004, provisional application No. 60/693,435, filed on Jun. 24, 2005.

(51) Int. Cl.
*H01L 27/088* (2006.01)
(52) U.S. Cl. ............... 257/401; 257/647; 257/E29.134; 257/E21.552; 438/297
(58) Field of Classification Search ........... 438/453, 438/297, 425; 257/366, 509, 510, 647, E21.545, 257/E21.552, E21.553, 401, E29.128, E29.134, 257/E21.507
See application file for complete search history.

(56) References Cited

U.S. PATENT DOCUMENTS 4,849,366 A * 7/1989 Hsu et al. ............... 438/216

| 5,528,065 | A | * | 6/1996 | Battersby et al. ............. 257/365 |
| 5,637,899 | A | * | 6/1997 | Eimori et al. ............... 257/347 |
| 6,121,657 | A | * | 9/2000 | Yama ......................... 257/341 |
| 6,146,978 | A | * | 11/2000 | Michael et al. ............. 438/453 |
| 6,586,807 | B2 | * | 7/2003 | Nishida et al. ............. 257/401 |
| 7,135,742 | B1 | * | 11/2006 | Harada et al. ............... 257/347 |
| 7,202,538 | B1 | * | 4/2007 | Hopper et al. .............. 257/374 |
| 2001/0042894 | A1 | * | 11/2001 | Brigham et al. ............. 257/408 |
| 2002/0048972 | A1 | * | 4/2002 | Yamaguchi et al. ......... 438/926 |
| 2005/0207351 | A1 | | 9/2005 | Inagawa |

* cited by examiner

*Primary Examiner*—Minh-Loan T Tran
*Assistant Examiner*—W. Wendy Kuo

(57) ABSTRACT

An IGFET that minimizes the effect of the dislocation at the edge of the device region by displacing the lateral edges of the source and drain regions from the adjacent edge of the opening and the dislocation. This minimizes the lateral diffusion of the source and drain impurities and the formation of metal silicides into the dislocation region. The spacing of the lateral edges of the source and drain regions from the adjacent edge of the opening and the dislocation region is produced by providing additional lateral opposed second gate regions or oxide barrier layer extending from the oxide layer into the adjacent regions of the substrate region and the first gate region extending therebetween. Both the first gate region and the two second gate regions or barrier layer are used in the self-aligned processing of the source and drain regions. The first gate region defines the length of the channel, while the two opposed second gate regions or barrier layer define the width of the channel region. The second gate portion or barrier extends sufficiently into the substrate region to space the width of the channel from the adjacent edge of the opening in the oxide.

11 Claims, 6 Drawing Sheets

ESD STRUCTURE

CROSS REFERENCE

The present application claims the benefit of provisional U.S. application Ser. No. 60/625,584 filed Nov. 8, 2004 and Ser. No. 60/693,435 filed Jun. 24, 2005, which are incorporated herein by reference.

BACKGROUND AND SUMMARY OF THE DISCLOSURE

The present disclosure relates generally to electrostatic discharge (ESD) protection and, more specifically, to an improved transistor for use in an ESD circuit. The improved transistor will also provide a more robust ESD performance when used in circuitry not directly related to ESD protection.

For processes that use LOCOS (localized oxidation of silicon), shallow or deep trench isolation and other methods to define active device regions, defects occur at the edge of the isolation. As illustrated in FIG. 1 where LOCOS isolation is used as an example, a substrate 10 has a nitride mask 14 separated from the surface of the substrate 10 by an oxide layer 12. The substrate 10 is subject to an oxidizing atmosphere, and local oxidation of the exposed surface of the oxide layer 12 grows to produce LOCOS region 16, as shown in FIG. 2. A bird's beak portion 18 extends under the nitride mask 14. The area within the edge of the bird's beak portion 18 of the LOCOS 16 defines a device region 20.

There are several defects that are produced during LOCOS processing. A "white ribbon" occurs when the silicon near the bird's beak 18 becomes nitrified and results in a weakness in the oxide growing over that region during subsequent processing. This defect is well understood and effectively eliminated in improved LOCOS processing.

A second defect is a stress-related defect. This occurs when certain combinations of nitride 14 thickness, oxide 12 thickness and the LOCOS operating conditions are utilized. Generally, thick nitrides 14 cause stress at the bird's beak 18 during oxidation. This can produce dislocations in the silicon or substrate 10 below the bird's beak region 18. It is very difficult to completely remove this stress-related defect. Likewise for other types of device isolation such as deep or shallow trench, there are stress-related and processing-related defects.

These dislocations are believed to cause accelerated diffusion of impurities which form the source and drain region under bird's beak 18 and the LOCOS 16. An insulated gate field effect transistor (IGFET) of the prior art is illustrated in FIG. 3 as including a gate 22 separated from the surface of the substrate 10 by an insulative layer of oxide 21. The gate 22 is used as a diffusion mask to form a self-aligned source region 24 and drain region 26. As illustrated by the dashed lines, the dislocation causes diffusion of the source and drain regions under the bird's beak 18 and the LOCOS 16. The lateral diffusion is also illustrated in FIG. 4, which shows four different gates separating three sources 24 from two drains 26.

In a normal operation of the IGFET, the biasing of the gate causes an inversion of the channel region 28 to form a conduction path between the source and drains.

Generally, a parasitic bipolar transistor formed between the source and drain regions and the uninverted portion of the substrate 10 will have little effect on the normal operation of the field effect transistor. When the field effect transistor is used as an ESD protection device, the parasitic bipolar transistor can be utilized to create a snapback characteristic that is advantageous for some types of ESD protection. However, portions of the source and drain regions 24, 26 which are below the bird's beak 18 in the dislocation area have a lower threshold and turn on first. This is an undesirable effect.

Another condition which lowers the resistance and the there by the threshold at the edge is formation of metal silicides. The application of metal contact to the source and drain regions 24, 26 and/or to the gate 22 or metal gates form metal silicides. This in combination with the dislocation area allows, in some instances, the portions of the source and drain regions 24, 26 which are below the bird's beak 18 in the dislocation area to turn on first. This is caused by the silicide processing that can cause the silicide to 'decorate' the defect.

The present IGFET minimizes the effect of the dislocation at the edge of the device region by displacing the lateral edges of the source and drain regions from the adjacent edge of the opening and the dislocation. This minimizes the lateral diffusion of the source and drain impurities and the formation of metal silicides into the dislocation region. The spacing of the lateral edges of the source and drain regions from the adjacent edge of the opening and the dislocation region is produced by providing additional lateral opposed second gate regions or oxide barrier layer extending from the oxide layer into the adjacent regions of the substrate region and the first gate region extending therebetween. Both the first gate region and the two second gate regions or barrier layer are used in the self-aligned processing of the source and drain regions. The first gate region defines the length of the channel, while the two opposed second gate regions or barrier layer define the width of the channel region. The second gate portion or barrier extends sufficiently into the substrate region to space the width of the channel from the adjacent edge of the opening in the oxide.

The present device can be used in an ESD circuit in an integrated circuit. It may be connected with its source and drain regions between the supply terminals of the integrated circuit. It may also be connected to the input terminal and one of the supply terminals by itself or as part of a silicon controlled rectifier structure.

These and other aspects of the present disclosure will become apparent from the following detailed description of the disclosure, when considered in conjunction with accompanying drawings.

DETAILED DESCRIPTION OF THE PREFERRED EMBODIMENTS

Figure 1:
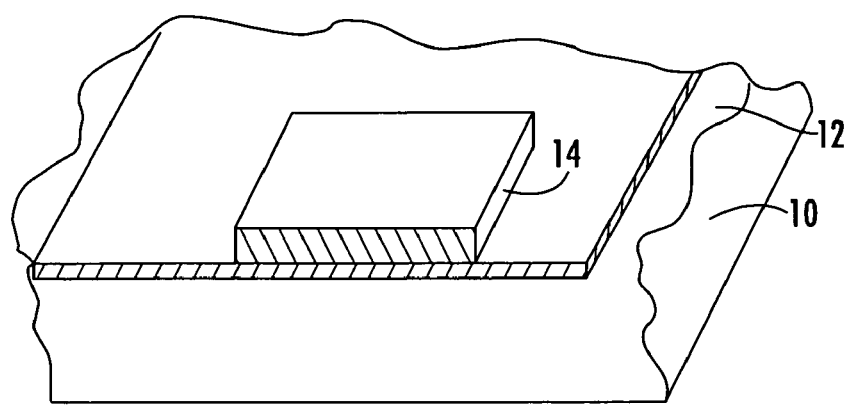
FIGS. 1 and 2 show a cross-sectional perspective of the process of forming LOCOS of the prior art.
Figure 2:
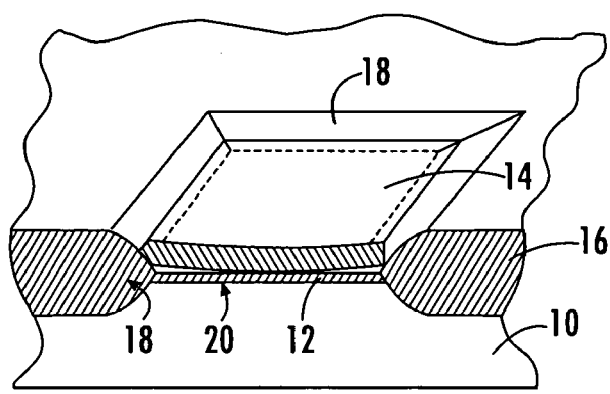
Figure 3:
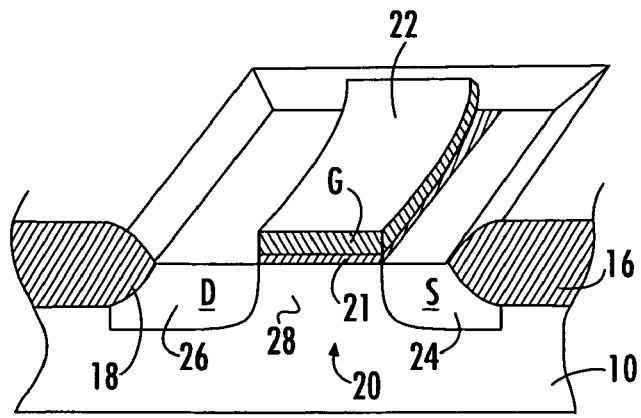
FIG. 3 shows an insulated gate field effect transistor (IGFET) using the process of FIGS. 1 and 2 of the prior art.
Figure 4:
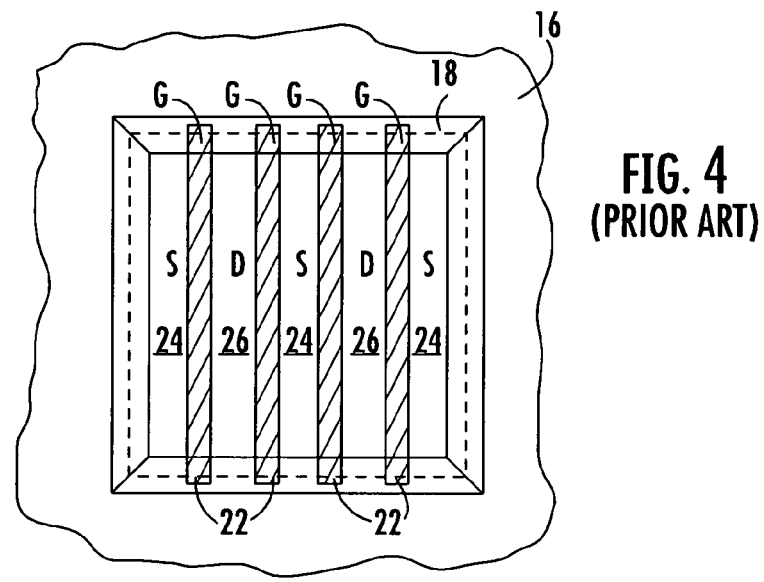
FIG. 4 is a plan view of a multi-source drain IGFET of the prior art.
Figure 5:
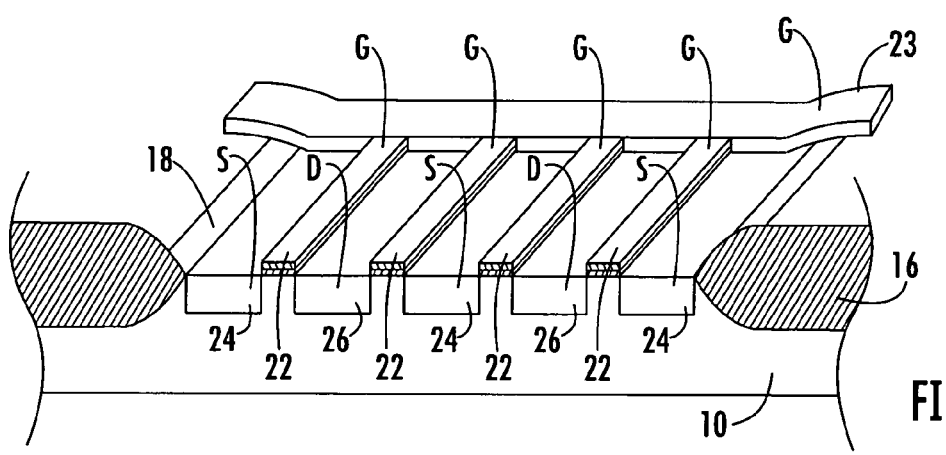
FIG. 5 is a cross-sectional perspective of an IGFET according to the present disclosure.
Figure 6:
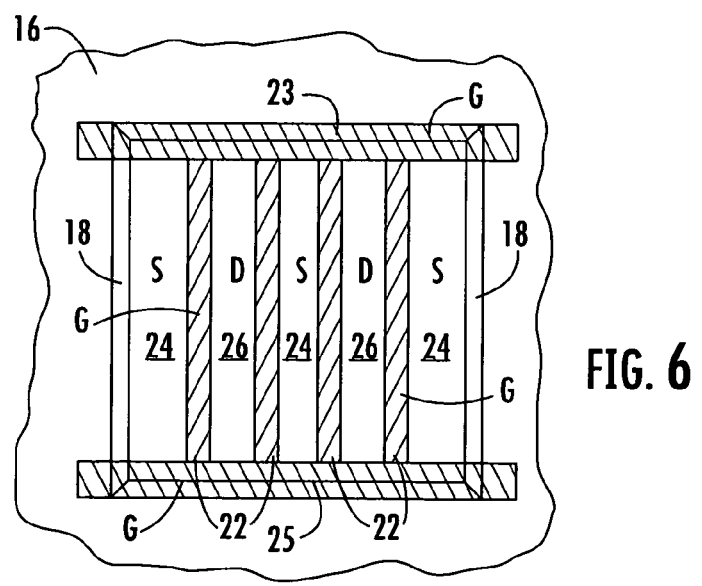
FIG. 6 is a plan view of the IGFET of FIG. 5.

An IGFET, according to the present disclosure, having a similar structure as that shown in FIG. 4 is illustrated in FIGS. 5 and 6. A plurality of first gate portions 22 lie on an insulative layer 21 in the device region 20 and separates a plurality of sources 24 and drains 26. A pair of opposed second gate portions 23, 25 extend from the LOCOS 16 over the bird's beak 18 onto the device region 20 of the substrate 10. The first gate portion 22 extends between the second gate portions 23, 25. The source regions 24 and the drain regions 26 have their lateral edges displaced from the edge of the device region 20, LOCOS 16 and bird's beak 18. The gate material may be polycrystalline silicon, for example.

The device of FIGS. 5 and 6 are produced using a self-aligned gate technique. By using the gate portions 22, 23, 25 in the self-alignment process, the first gate portion 22 defines the length of the channel regions 28, while the opposed gate regions 23, 25 define the width of the channel regions 28, as defined by the width of the source and drain regions 24, 26. The impurities that are introduced to form these source and drain regions 24, 26 use the gate portions 22, 23, 25 as masks. The extension of the second gate portions 23, 25 onto the device region 20 is sufficient such that the impurity introduction and subsequent treatment reduces the diffusion of the impurities from the source and drain regions 24, 26 into the stressed area under bird's beak 18 produced by the LOCOS operation. Also, the metal contacts to the source and drain regions 24, 25 and any resulting silicides are displaced from the stressed area. Any minor diffusion or silicide would create a very high resistance path, and therefore little, if any, current flow would be in the dislocation area adjacent the bird's beak 18.

Figure 14:
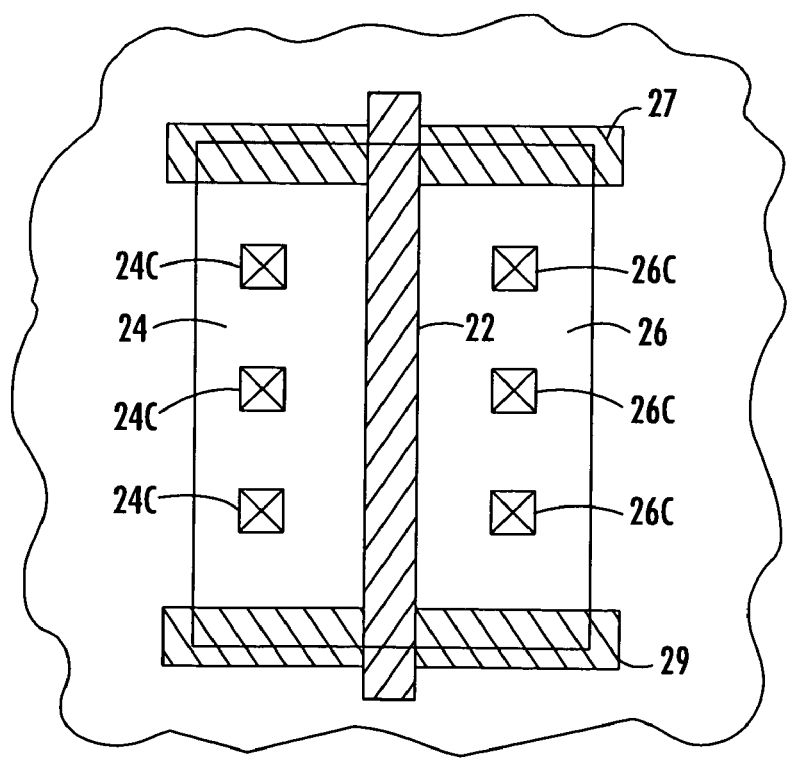
FIG. 14 is a plan view of a single source and drain IGFET having a barrier layer and with contacts.
Figure 15:
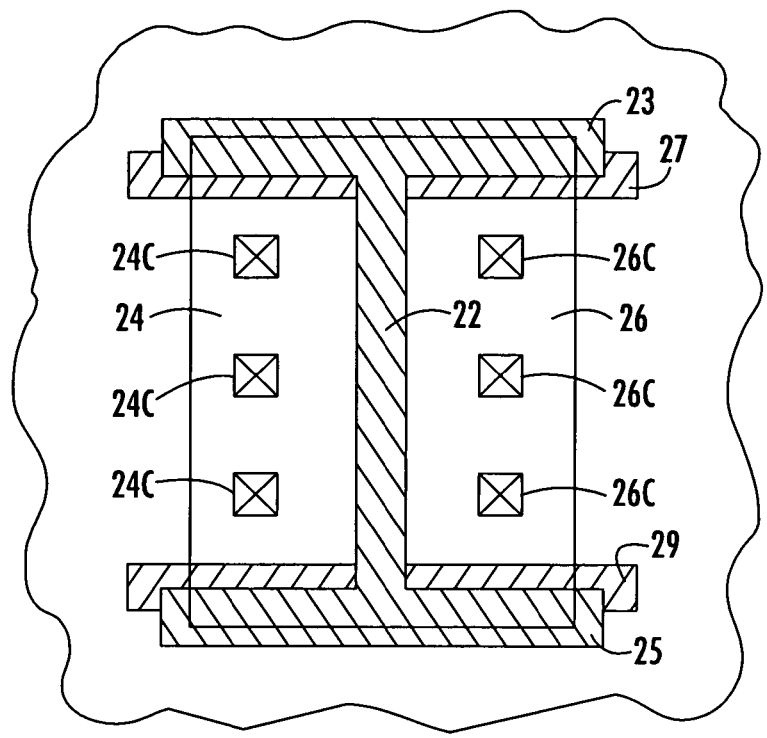
FIG. 15 is a plan view of a single source and drain IGFET combining the protection of FIGS. 13 and 14.
Figure 16:
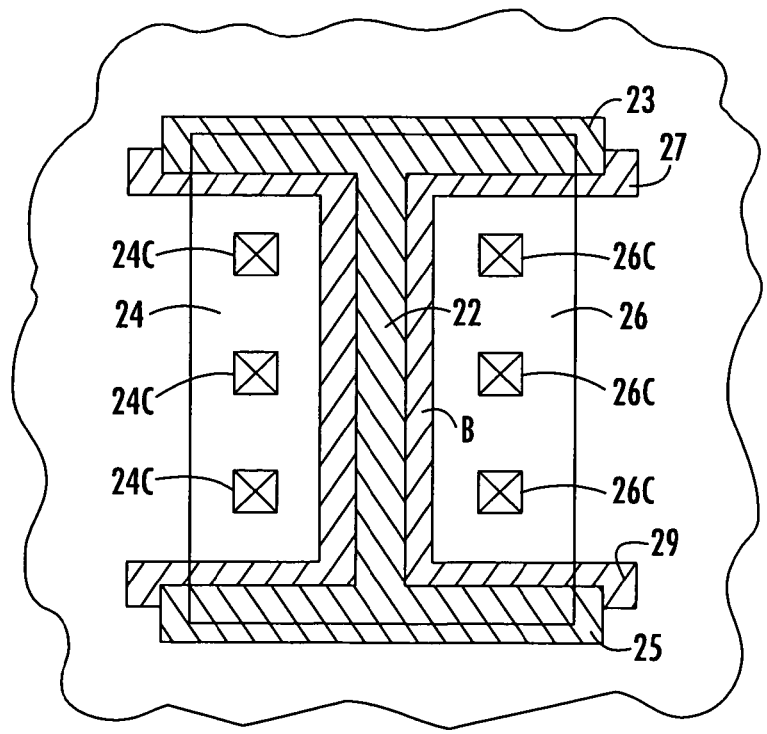
FIG. 16 is a plan view of a single source and drain IGFET to FIG. 15 with ballasting.

Although the IGFET and process described in FIGS. 4-6 use the additional gate portions 23, 25 as a barrier or mask to form the source and drain regions spaced from the stressed area under bird's beak 18, the barrier 23, 25 may be an additional oxide layer formed before or after the gate layer, but before the formation of the source and drain regions. The additional oxide layer is shown in FIGS. 14-16 as 27 and 29 in combination with the gate 22. The additional oxide layer is not only a mask for the source and drain but is also a barrier for the silicide formation during metallization and serves to displace the location of the formed silicides. If the gate material is a metal, the oxide barrier 27, 29 would be formed before the metal gate layer.

Figure 13:
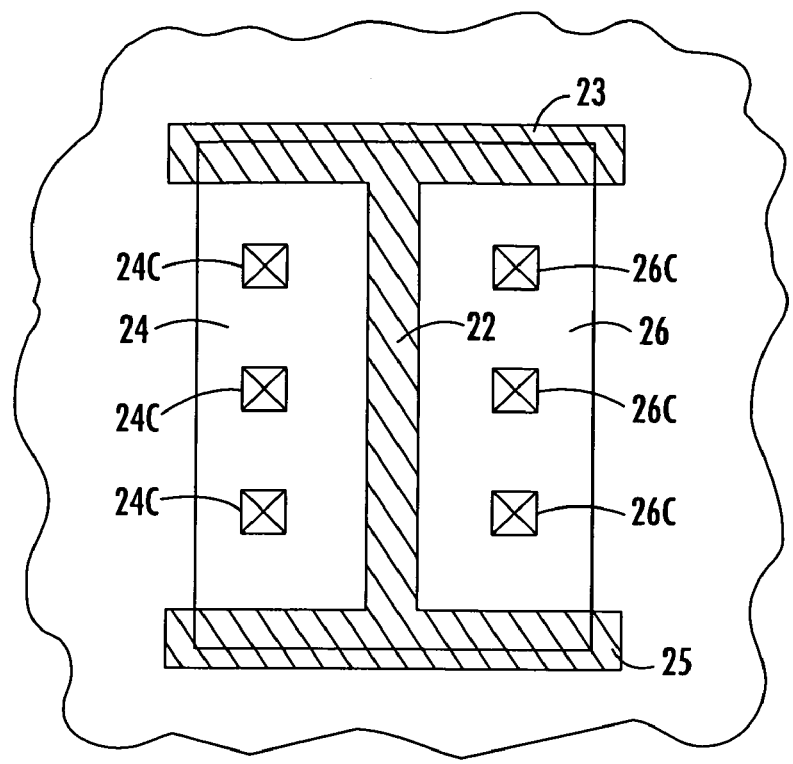
FIG. 13 is a plan view of a single source and drain IGFET similar to FIG. 6 with contacts.

In FIGS. 13-16, the source contacts 24C and the drain contacts 26C are shown. FIG. 13 is a single source and drain device with gate material barriers 23, 25, while FIG. 14 has oxide barriers 27, 29. FIG. 15 is a combination of the gate material barriers 23, 25 and the oxide barriers 27, 29. FIG. 16 is similar to FIG. 15 with the addition of an oxide ballasting B extending past the lateral edges of the gate 22.

Figure 7:
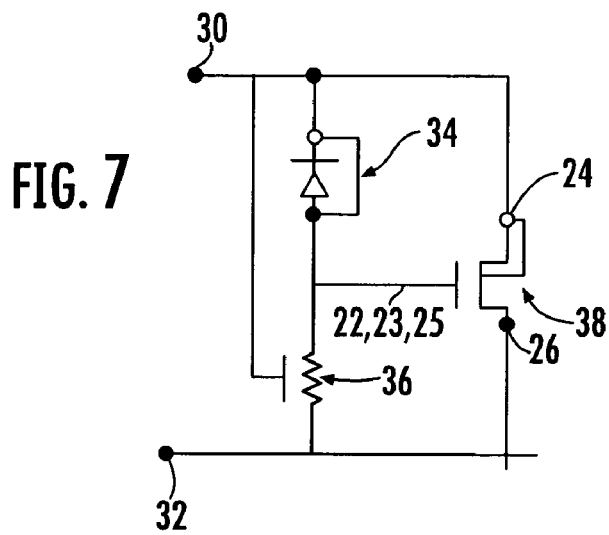
FIG. 7 is an electrical schematic of an ESD protection circuit.
Figure 8:
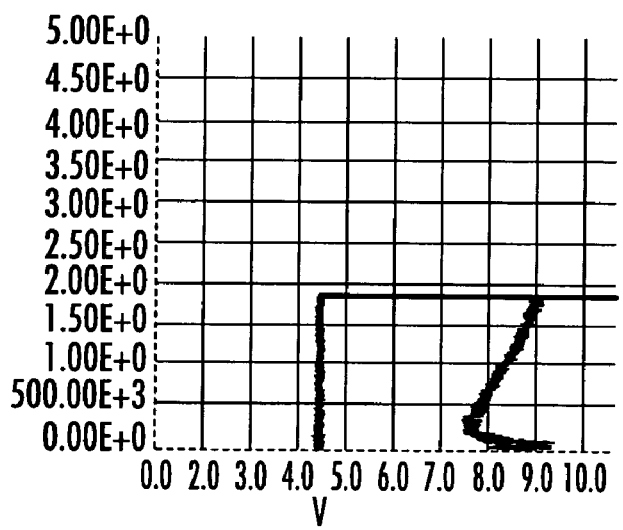
FIG. 8 is a graph of the voltage-current characteristics of the prior art IGFET used in the circuit of FIG. 7.
Figure 9:
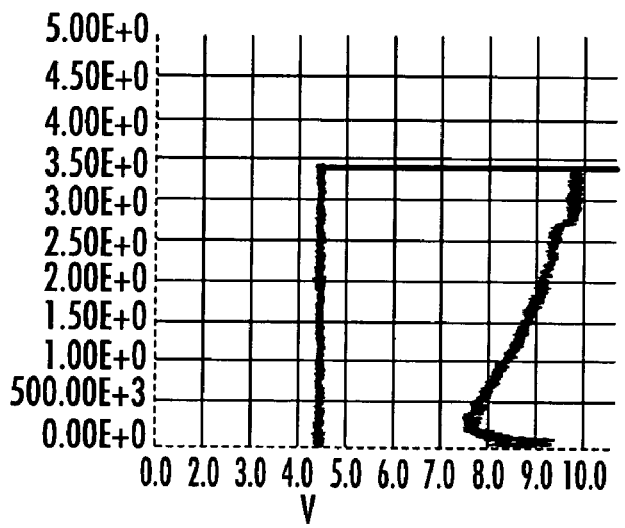
FIG. 9 is a voltage-current graph of the presently disclosed IGFET used in the circuit of FIG. 7.

The present IGFET may be used, and has been designed for use, in an ESD protection circuit. A typical example is illustrated in FIG. 7. Between terminals 30, 32 is a series connection of diode 34 and resistor 36. A gate portion of the resistor 36 is connected to terminal 30. Also, connected across terminals 30, 32 is an IGFET 38, according to the present disclosure, having its source 24 connected to terminal 30, its drain 26 connected to terminal 32 and its gates 22, 23, 25 connected between the diode 34 and the resistor 36. Although the additional gate or barrier portions 23, 25 are only shown at two edges of the exposed substrate, they may extend over all four edges FIGS. 8 and 9, respectively, show the voltage-current curve or response of a prior art IGFET and presently disclosed IGFET used in circuit of FIG. 7 in response to a transmission line pulse (TLP). As can be seen, the present IGFET has a limit of 3.5 clamps. This is a significant improvement. The corresponding improvement in human body model (HBM) ESD occurred also. The following is a chart of ten units each in the same production line:

| Unit # | Standard 7 V Clamp w/Gate = 1.3 u (Prior Art) | Standard 7 V Clamp w/Poly over LOCOS Edge and Gate = 1.3 u (New Art) |
|---|---|---|
| 1 | 3.0 KV | 5.75 KV |
| 2 | 3.0 KV | 6.0 KV |
| 3 | 3.0 KV | 5.75 KV |
| 4 | 3.0 KV | 5.75 KV |
| 5 | 3.25 KV | 6.0 KV |
| 6 | 3.25 KV | 5.75 KV |
| 7 | 3.0 KV | 5.5 KV |
| 8 | 3.25 KV | 6.5 KV |
| 9 | 3.0 KV | 6.0 KV |
| 10 | 3.0 KV | 5.75 KV |

As can be seen in the chart, the addition of the second gates over the LOCOS edge has resulted in significantly improved HBM results (namely, almost doubling). This is in line with the TLP results of FIGS. 8 and 9.

Figure 10:
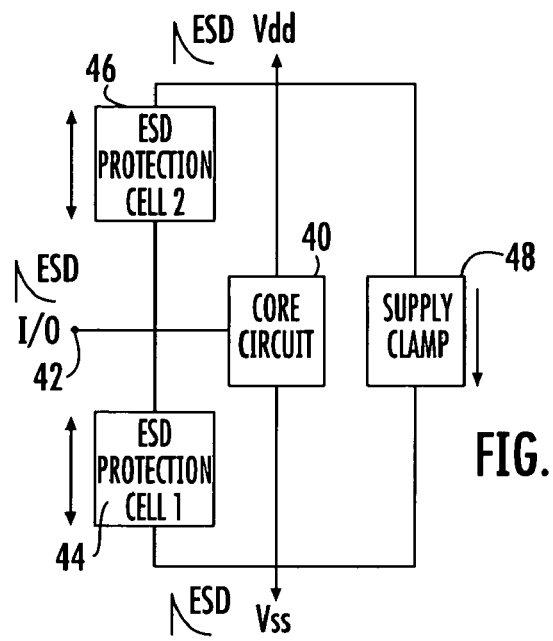
FIGS. 10 and 11 are schematic views of various ESD and supply clamp circuits.
Figure 11:
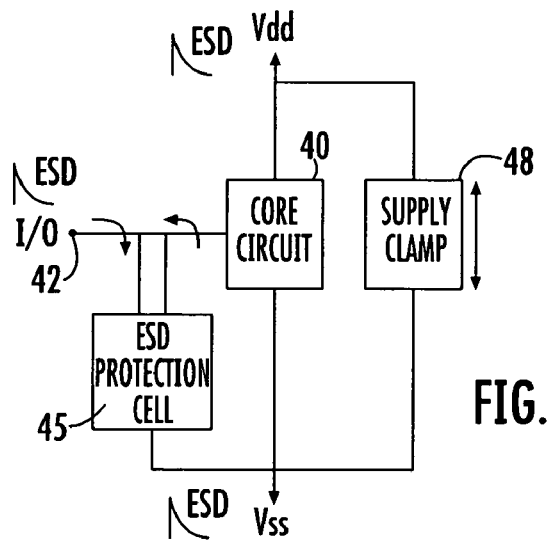

Various ESD protection devices or clamps are illustrated in FIGS. 10 and 11. The core circuit 40 includes an input terminal 42. In FIG. 10, a pair of ESD devices 44, 46 are connected between the input terminal 42 and the two voltage supply terminals VSS, VDD. The ESD devices 44, 46 are generally unipolar devices. A supply clamp 48 is connected between the supply terminals VDD, VSS. FIG. 11 shows a similar circuit with a single ESD protection cell 45, which is capable of bipolar operation, connected between the input terminal 42 and the voltage source VSS.

Figure 12:
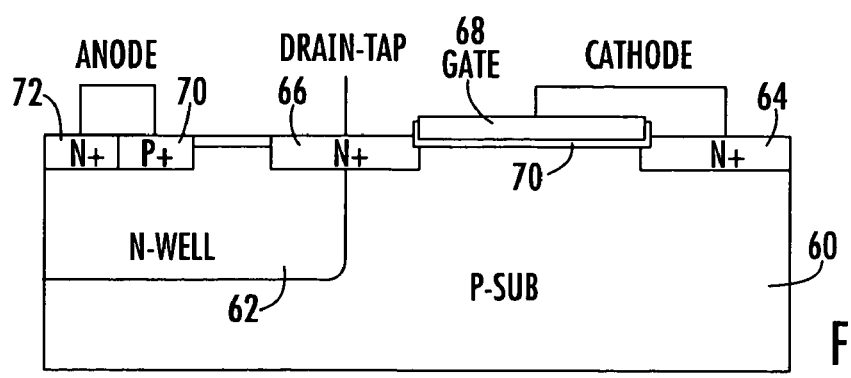
FIG. 12 is a cross-sectional perspective of an SCR device in which the presently disclosed IGFET may be incorporated.

The present IGFET structure may be part of a silicon controlled diode SCR, as illustrated in FIG. 12. This is a low trigger voltage SCR. It includes a well region 62 formed in substrate 66. A source region 64 is formed in the substrate 60, and a drain region 66 is formed across substrate 60 and the well 62. Gate 68 is separated from the substrate 60 by an insulative layer 70. Anode region 70 is formed in well 62, as is well contact 72. The gate 68 is shown connected to the source 64 and forms a cathode of the SCR, and the region 70 is connected to the well contact 72 and forms the anode. These devices also have snapback and, therefore, would benefit from the presently disclosed structure.

As can be seen from the present disclosure, the present IGFET device can be formed as part of any MOS-CMOS-BICMOS process without many modifications other than the formation of the additional gate portions. It should also be noted that the process can also be used with variation of lateral dielectric isolation, including trench isolation, and any process which would form a dislocation region adjacent the device formation region of the substrate.

The present device provides a substantial increase in ESD protection without an increase of area. Based on the results, it is even possible to reduce the area to provide ESD protection since the higher voltage capabilities can be accommodated.

Although the present disclosure has been described and illustrated in detail, it is to be clearly understood that this is done by way of illustration and example only and is not to be taken by way of limitation. The scope of the present disclosure is to be limited only by the terms of the appended claims.

What is claimed:

1. An integrated circuit comprising:
   a substrate;
   a first oxide layer extending into the substrate and having openings to surface regions of the substrate;
   devices formed in the substrate regions;
   one of the devices being an insulated gate field effect transistor having a source region, drain region, and corresponding active gate, the source and drain regions being spaced in one of the substrate regions and self-aligned with the active gate of the transistor;
   the active gate including:
      a first gate portion extending over the substrate region between the corresponding source and drain regions; and
      a pair of second gate portions, the second gate portions each being electrically connected to each other only by the first gate portion and each extending transverse to the first gate portion, the pair of second gate portions extending from the first oxide layer overlapping an entire edge of the opening which is transverse to the first gate portion as well as two opposing edges of the opening which are parallel to the first gate portion onto adjacent edges of the substrate region;
   wherein lateral edges of the source and drain regions parallel to the second gate portion are spaced from the first oxide layer and an edge of the source region parallel to the first gate portion touches the first oxide layer; and
   including a second oxide layer juxtaposed from the second gate portion and extending from the first oxide layer onto the adjacent edge of the substrate region and only to the lateral edge of the source and drain regions.

2. The integrated circuit according to claim 1, wherein at least a portion of the second oxide layer is below at least the second gate portion.

3. The integrated circuit according to claim 1, wherein the second oxide layer is above the second gate portion.

4. The integrated circuit according to claim 1, wherein the first oxide layer extending into the substrate is one of local oxidation and oxide trench isolation.

5. A method of forming an integrated circuit including an insulated gate field effect transistor having a source region, a drain region and a corresponding active gate, the method comprising:

locally oxidizing exposed surfaces of a substrate to form an oxide layer extending into the substrate with exposed regions of the substrate;

forming the active gate over at least one of the exposed substrate regions, the active gate having a first gate portion extending between two opposed edges of the exposed substrate region;

forming a first pair of opposed barrier layers simultaneously with the first gate portion, the pair of opposed barrier layers each being electrically connected to each other only by the first gate portion and each extending from the oxide layer overlapping an entire edge of the exposed substrate region which is transverse to the first gate portion as well as two opposing edges of the exposed substrate region which are parallel to the first gate portion, wherein the first pair of opposed barrier layers extend onto the opposed adjacent edges of the exposed substrate region transverse to the first gate portion;

forming a second pair of opposed barrier layers juxtaposed from the first pair of opposed barrier layers and extending from the first oxide layer onto the adjacent edge of the substrate region beyond the first pair of opposed barrier layers; and introducing impurities into portions of the exposed substrate region between the gate and the opposed barrier layers to form at least one source region and one drain region adjacent opposed edges of the first gate portion and extending between the second pair of opposed barrier layers such that edges of the source and drain regions parallel to the second pair of opposed barrier layers are spaced from the oxide layer and an edge of the source region parallel to the first gate portion touches the oxide layer.

6. The method according to claim 5, wherein the exposed surface for local oxidation is a top surface of the substrate.

7. The method according to claim 5, wherein the exposed surface for local oxidation is a trench surface in the substrate.

8. The integrated circuit according to claim 1, wherein the first and second gate portions each includes a conductor separated from the substrate by the second oxide layer.

9. The integrated circuit according to claim 1, wherein the second oxide layer is below the first gate portion and extends substantially laterally beyond a lateral edge of the first gate portion to provided a ballast.

10. The method according to claim 5, wherein the second pair of opposed burier layers are formed before the first pair of opposed burier layers.

11. The method according to claim 10, wherein the second pair of opposed burier layers includes a portion below the gate and extending laterally beyond the gate.

* * * * *